United States Patent
Liu et al.

(10) Patent No.: US 11,711,963 B2
(45) Date of Patent: Jul. 25, 2023

(54) DISPLAY PANEL, MASK, METHOD FOR MANUFACTURING DISPLAY PANEL, AND DISPLAY DEVICE

(71) Applicants: WUHAN TIANMA MICROELECTRONICS CO., LTD., Wuhan (CN); WUHAN TIANMA MICROELECTRONICS CO., LTD. SHANGHAI BRANCH, Shanghai (CN)

(72) Inventors: Liyuan Liu, Shanghai (CN); Zhiyong Xiong, Shanghai (CN); Di Zhu, Shanghai (CN); Yawei Zhong, Shanghai (CN)

(73) Assignees: WUHAN TIANMA MICROELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 220 days.

(21) Appl. No.: 17/138,915

(22) Filed: Dec. 31, 2020

(65) Prior Publication Data
US 2021/0119188 A1 Apr. 22, 2021

Related U.S. Application Data

(62) Division of application No. 16/266,068, filed on Feb. 3, 2019, now Pat. No. 10,916,737.

(30) Foreign Application Priority Data

Aug. 29, 2018 (CN) .......................... 201810996167.6

(51) Int. Cl.
H01L 51/56 (2006.01)
H10K 71/00 (2023.01)
(Continued)

(52) U.S. Cl.
CPC ........... *H10K 71/00* (2023.02); *C23C 14/042* (2013.01); *H10K 59/122* (2023.02);
(Continued)

(58) Field of Classification Search
CPC ... H01L 51/56; H01L 51/0011; C23C 14/042; C23C 16/042; C23C 14/24
See application file for complete search history.

(56) References Cited

U.S. PATENT DOCUMENTS 7,914,971 B2 * 3/2011 Ohnuma ........... H01L 29/42384
430/311
9,735,185 B1 * 8/2017 Evans, V .............. G06F 1/1605
(Continued)

*Primary Examiner* — Jaehwan Oh
(74) *Attorney, Agent, or Firm* — Kilpatrick Townsend & Stockton LLP

(57) ABSTRACT

The present invention provides a mask, a display panel, a method for manufacturing a display panel, and a display device. The display panel has a hollow region and a display region surrounding the hollow region. The display panel includes a plurality of organic light-emitting devices arranged only in the display region. Each of the plurality of organic light-emitting devices includes an anode layer, a cathode layer, a light-emitting layer and a functional layer. The functional layer includes a plurality of uneven portions.

6 Claims, 9 Drawing Sheets

(51) Int. Cl.
   *C23C 14/04*    (2006.01)
   *H10K 59/122*   (2023.01)
   *H10K 71/16*    (2023.01)
   *H10K 59/131*   (2023.01)
   *H10K 59/12*    (2023.01)

(52) U.S. Cl.
   CPC ....... *H10K 71/166* (2023.02); *H10K 59/1201* (2023.02); *H10K 59/131* (2023.02); *H10K 71/851* (2023.02)

(56) References Cited

U.S. PATENT DOCUMENTS

| | | | |
|---|---|---|---|
| 2012/0234236 A1* | 9/2012 | Ko | B05B 12/20 118/504 |
| 2013/0093049 A1* | 4/2013 | Ananthan | C23C 14/042 257/532 |
| 2013/0192521 A1* | 8/2013 | Chu | C23C 14/042 118/504 |
| 2018/0198067 A1* | 7/2018 | Kim | C23C 16/042 |
| 2018/0342700 A1* | 11/2018 | Cai | H10K 59/1213 |
| 2019/0043934 A1* | 2/2019 | Ukigaya | H10K 50/813 |
| 2019/0148680 A1* | 5/2019 | Xin | H10K 59/131 257/91 |
| 2020/0058726 A1* | 2/2020 | Ma | H10K 59/352 |
| 2021/0119188 A1* | 4/2021 | Liu | H10K 71/00 |

* cited by examiner providing a substrate and at least one mask, wherein the substrate has a first region and a second region, a projection of the first region on a plane of the substrate does not overlap with a projection of the second region on the plane of the substrate, each of the at least one mask includes an aperture portion and at least one shielding portion, and the at least one shielding portion extends from an edge of the mask into the mask — S1 forming a functional layer on a side of the substrate sequentially by vapor deposition through the aperture portion of the at least one mask, wherein the functional layer includes a first functional portion, a second functional portion, and an uneven portion, and the first functional portion and the second functional portion are respectively located on two sides of the uneven portion; wherein the first functional portion covers the second region, the second functional portion covers the first region, and the first functional portion and the second functional portion are arranged in a same layer — S2

FIG. 13

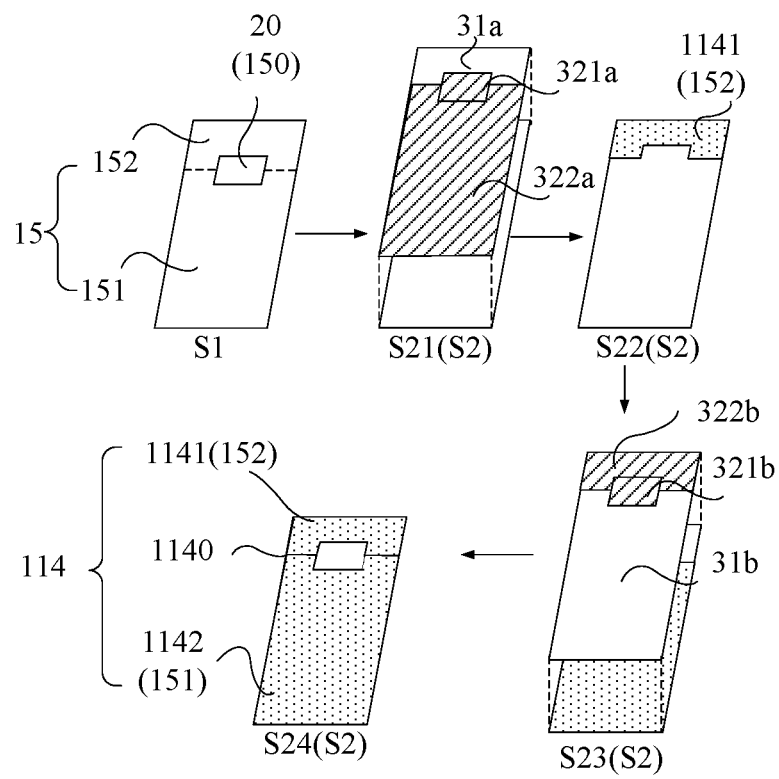

FIG. 14

DISPLAY PANEL, MASK, METHOD FOR MANUFACTURING DISPLAY PANEL, AND DISPLAY DEVICE

CROSS-REFERENCE TO RELATED APPLICATIONS

The present application is a divisional application of U.S. Ser. No. 16/266,068, filed Feb. 3, 2019, which claims priority to Chinese Patent Application No. 201810996167.6, filed on Aug. 29, 2018; the content of these applications is incorporated herein by reference in its entirety.

FIELD

The present disclosure relates to the field of display technologies, and in particular, relates to a display panel, a mask, a method for manufacturing a display panel, and a display device.

BACKGROUND

With the development of display technologies and diversified requirements of users for display devices, a special-shaped displayer having an aperture arranged in the middle has gained more and more attention.

However, for an OLED displayer, since functional film layers such as an electron transport layer and an electron injection layer are formed by vapor deposition, it is needed to avoid the area where the aperture is located for all film layers when manufacturing the special-shaped OLED displayer. This increases the manufacturing difficulty.

SUMMARY

In view of this, the present disclosure provides a mask, a display panel, a method for manufacturing a display panel, and a display device, aiming to solve the problem of the big difficulty in manufacturing a special-shaped OLED display having aperture arranged in the middle position in the related art.

In an aspect, the present disclosure provides a display panel. The display panel has a hollow region and a display region surrounding the hollow region. The display panel includes: a plurality of organic light-emitting devices, the plurality of organic light-emitting devices being arranged only in the display region rather than in the hollow region. Each of the plurality of organic light-emitting devices includes an anode layer, a cathode layer, a light-emitting layer and a functional layer. The functional layer includes a plurality of uneven portions.

In another aspect, the present disclosure provides a method for manufacturing a display panel. The method includes: providing a substrate and at least one mask, and the substrate has a first region and a second region, a projection of the first region on a plane of the substrate does not overlap with a projection of the second region on the plane of the substrate, the first region and the second region each extend from an edge of the substrate into the substrate, each of the at least one mask includes an aperture portion and at least one shielding portion, and the at least one shielding portion extends from an edge of the mask into the mask; and forming a functional layer on a side of the substrate sequentially by vapor deposition through the aperture portion of the at least one mask, and the functional layer includes a first functional portion, a second functional portion, and an uneven portion, and the first functional portion and the second functional portion are respectively located on two sides of the uneven portion. The first functional portion covers the second region, the second functional portion covers the first region, and the first functional portion and the second functional portion are arranged in a same layer.

In still another aspect, the present disclosure provides a mask. The mask includes an aperture portion and a shielding portion, and the shieling portion extends inward from an edge of the mask.

In yet still another aspect, the present disclosure provides a display device. The display device includes the above-mentioned display panel.

BRIEF DESCRIPTION OF DRAWINGS

Embodiments of the present disclosure are described in the accompanying drawings. It should be noted that the drawings described as follows are merely part of the embodiments of the present disclosure.

FIG. 13 is a schematic flowchart of a method for manufacturing a display panel according to an embodiment of the present disclosure;

FIG. 14 is a schematic structural flowchart of the method of FIG. 13;

DESCRIPTION OF EMBODIMENTS

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that although a mask may be described using the terms of "first", "second", etc., in the embodiments of the present disclosure, the mask will not be limited to these terms. These terms are merely used to distinguish masks from one another. For example, without departing from the scope of the embodiments of the present disclosure, a first mask may also be referred to as a second mask, and similarly, a second mask may also be referred to as a first mask.

Figure 1:
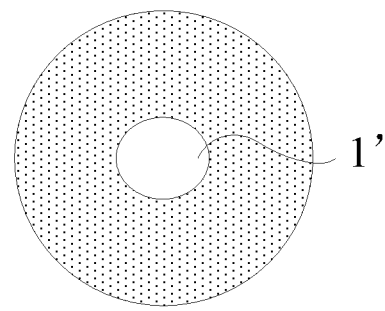
FIG. 1 is a schematic diagram illustrating a shape of a special-shaped displayer having an aperture arranged in the middle in the related art.

FIG. 1 is a schematic diagram illustrating a shape of a special-shaped displayer having an aperture arranged in the middle in the related art. With the development of display technologies and diversified requirements of users for display devices, the special-shaped displayer as shown in FIG. 1 has gained more and more attention.

However, for an OLED displayer, since functional film layers such as an electron transport layer and an electron injection layer are formed by vapor deposition, it is needed to avoid the area where the aperture is located for all film layers when manufacturing the special-shaped OLED displayer. This increases the manufacturing difficulty.

At present, the special-shaped OLED display panel as shown in FIG. 1 is generally manufactured by following methods.

Figure 2:
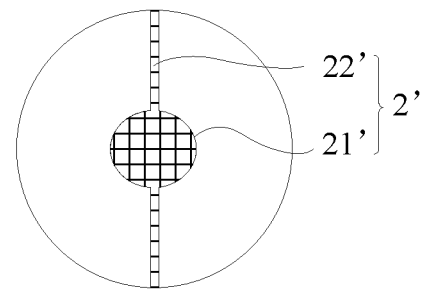
FIG. 2 is a schematic diagram of a mask in the related art.

In a first method, a mask as shown in FIG. 2 is used. FIG. 2 is a schematic diagram of a mask in the related art. The mask 2' includes a baffle 21' for shielding the middle aperture region of the special-shaped display panel. The mask 2' further includes a support pillar 22' for supporting the baffle 21'. When the special-shaped display panel shown in FIG. 1 is manufactured by using the mask 2', a part of the display panel corresponding to the support pillar 22' cannot be vapor-deposited due to the existence of the support pillar 22', which would have an influence on displaying of the display panel.

In a second method, the aperture region 1' in the middle of the special-shaped display panel is first ignored, and then film layers including an electron transport layer, an electron injection layer and the like functional film layer are manufactured without an aperture. Then, the respective film layers located at the aperture region 1' are removed so as to form a shape as shown in FIG. 1. However, when manufacturing is carried out by this method, material residues will unavoidably remain when the film layers located at the aperture region 1' are removed, and may affect the subsequent packaging process of the display panel.

Figure 3:
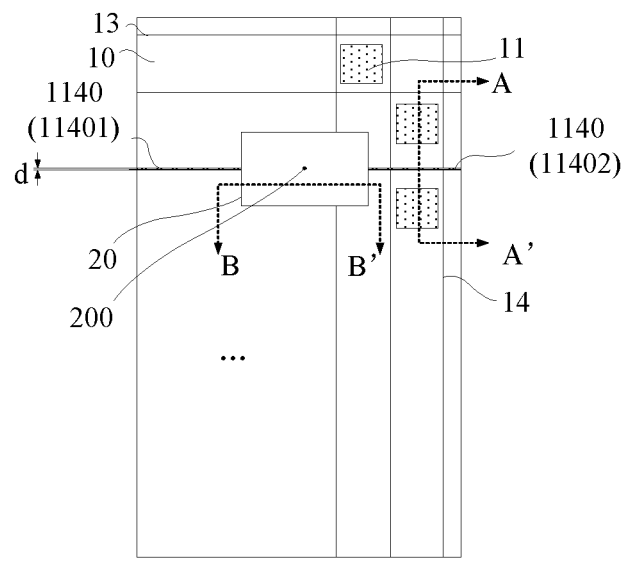
FIG. 3 is a top view of a display panel according to an embodiment of the present disclosure.

In view of this, an embodiment of the present disclosure provides a display panel. FIG. 3 is a top view of a display panel according to an embodiment of the present disclosure. As shown in FIG. 3, the display panel includes a hollow region 20 and a display region 10 surrounding the hollow region 20. A plurality of organic light-emitting devices 11 is provided in the display region 10, and no organic light-emitting device 11 is provided in the hollow region 20.

Figure 4:
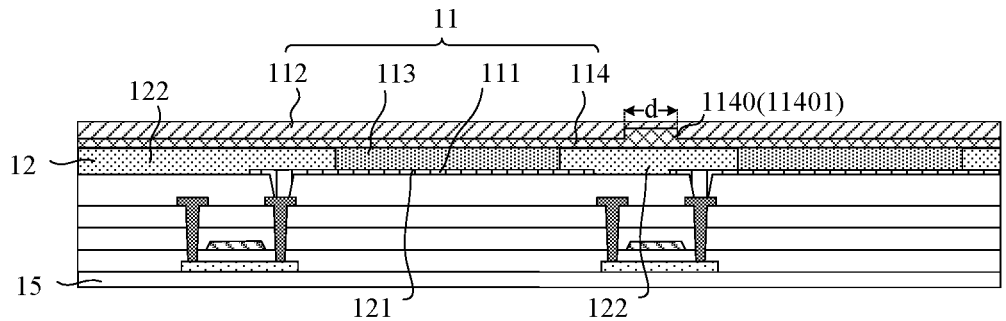
FIG. 4 is a schematic cross-sectional view along AA' of FIG. 3.

FIG. 4 is a schematic cross-sectional view along AA' of FIG. 3. As shown in FIG. 3 and FIG. 4, the organic light-emitting device 11 includes an anode layer 111, a cathode layer 112, a light-emitting layer 113, and a functional layer 114. The functional layer 114 includes a plurality of uneven portions 1140.

Figure 5:
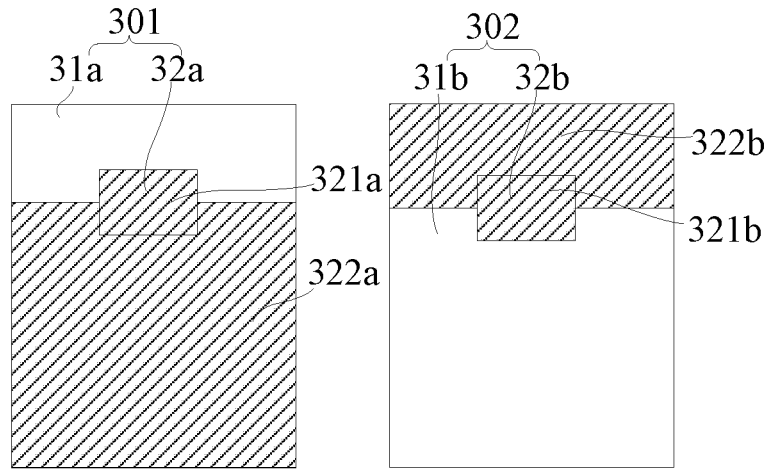
FIG. 5 is a schematic diagram of a mask according to an embodiment of the present disclosure.

In this embodiment of the present disclosure, by setting the uneven portions 1140 in the functional layer 114 included in the display panel, the display region 10 of the display panel can be divided into at least two parts when manufacturing the display panel. Here, each part of the divided display region 10 extends from an edge of the display panel into the display panel. Then, a first mask and a second mask as shown in FIG. 5 are used to form the functional layer 114 covering the entire display region 10 by at least two vapor deposition processes. FIG. 5 is a schematic diagram of a mask according to an embodiment of the present disclosure. Here, patterns of the first mask 301 and the second mask 302 are in one-to-one correspondence with respective shapes of the plurality of parts into which the display region 10 is divided, that is, shielding portions of the first mask 301 and the second mask 302 each extend from the edge into the first mask 301 and the second mask 302. In this way, when manufacturing the display panel including the hollow region 20, it is not necessary to perform cutting and the like operation on the hollow region 20 of the display panel. As a result, cutting residues can be avoided, and thus reliable packaging of the display panel can be achieved. Moreover, since the shielding portions of the first mask and the second mask each extend from the edge of first mask 301 and the second mask 302 into the first mask 301 and the second mask 302, there is no need to additionally provide a support pillar for the first mask and the second mask to support the shielding portions. In this way, the influence on vapor deposition of the display region 10 can be avoided, and the problem that the position other than the hollow region 20 cannot be vapor-deposited can be avoided, thereby improving the display effect of the display panel.

In an example, as shown in FIG. 3 and FIG. 4, the uneven portions 1140 do not overlap with the light-emitting layer 113. By setting that the uneven portions do not overlap with the light-emitting layer, i.e., by setting the boundaries that divide the display region 10 into a plurality of parts to not overlap with the light-emitting layer 113, the present disclosure can avoid the influence on the light-emitting layer 113 emitting light, such that the light-emitting layer 113 can normally emit light, thereby achieving the display effect of the display panel including the hollow region 20 provided by this embodiment of the present disclosure.

It should be noted that the position relation between the functional layer 114 and the light-emitting layer 113 shown in FIG. 4 is merely illustrative, and in the actual designing and manufacturing process of display panel, the functional layer 114 may be arranged at a different position depending on a different function of the functional layer 114 in the display panel. For example, when the functional layer 114 is a buffer layer, a hole transport layer, or a hole injection layer, the functional layer 114 may be disposed between the anode layer 111 and the light-emitting layer 113 so as to improve injection and transport efficiency of holes. When the functional layer 114 is an electron injection layer or an electron transport layer, the functional layer 114 may be disposed between the cathode layer 112 and the light-emitting layer 113 so as to improve injection and transport efficiency of electrons. In an embodiment of the present disclosure, the functional layer 114 may include the buffer layer, the hole transport layer, the hole injection layer, the electron transport layer, and the electron injection layer at the same time, which is not limited herein. When the display panel provided by this embodiment of the present disclosure includes the buffer layer, the hole transport layer, the hole injection layer, the electron transport layer and the electron injection layer at the same time, the anode, the buffer layer, the hole injection layer, the hole transport layer, the light-emitting layer, the electron transport layer, the electron injection layer, and the cathode are stacked sequentially along a normal direction of the display panel. Here, the buffer layer is used to match an energy level difference between the anode and the hole injection layer, thereby improving injection and transport efficiency of holes. The buffer layer usually has a film thickness of approximately 300 Å.

In an embodiment, there are various forms for the above uneven portion 1140. For example, as shown in FIG. 4, the uneven portions 1140 include a protrusion 11401, and the protrusion 11401 does not overlap with the light-emitting layer 113.

Figure 6:
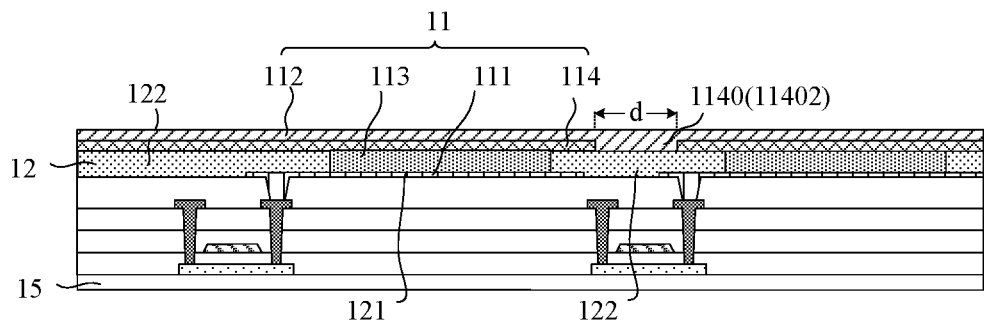
FIG. 6 is a cross-sectional view of another display panel according to an embodiment of the present disclosure.

In another example, as shown in FIG. 6, which is a cross-sectional view of another display panel according to an embodiment of the present disclosure, the uneven portions 1140 include a recess 11402, and the recess 11402 does not overlap with the light-emitting layer 113. It can be understood that the recess 11402 shown in FIG. 6 is in a state of being filled up by the cathode layer 112 formed above the functional layer 114.

In another example, for two uneven portions 1140 separated by the hollow region 20 as shown in FIG. 3, one uneven portion 1140 located on a side of the hollow region 20 is a protrusion 11401, and the other uneven portion 1140 located on the other side of the hollow region 20 is a recess 11402. Neither the protrusion 11401 or the recess 11402 overlaps with the light-emitting layer 113.

In an example, as shown in FIG. 4 and FIG. 6, the display region 10 of the abovementioned display panel further includes a pixel definition layer 12, and the pixel definition layer 12 includes a plurality of valleys 121 and a plurality of ridges 122. The functional layer 114 covers the valleys 121 and ridges 122 of the pixel definition layer 12. The light-emitting layer 113 is arranged only at the valleys 121 of the pixel definition layer 12, and the recess 11402 and the protrusion 11401 are arranged only at the ridges 122 of the pixel definition layer, so as to avoid the influence of the recess 11402 and the protrusion 11401 on light emitting of the light-emitting layer 113. This can allow the light-emitting layer 113 to emit light normally.

In an embodiment, as shown in FIG. 3, the display region 10 of the abovementioned display panel further includes a plurality of scan lines 13 and data lines 14. The scan lines 13 or the data lines 14 overlap with the convex portion 11401, and the scan lines 13 or the data lines 14 overlap with the recess 11402, so as to prevent the convex portion 11401 and the recess 11402 from overlapping with the organic light-emitting device 11, thereby achieving normal display of the organic light-emitting device 11.

In an embodiment, as shown in FIG. 3, FIG. 4 and FIG. 6, in a plane parallel to the display panel, along a direction of a shorter edge of the uneven portion 1140, a width d of the uneven portion 1140 satisfies 0.005 µm≤d≤0.35 µm, and is smaller than a size of the support pillar 22' of the mask 2' shown in FIG. 2. This can avoid the influence on normal display of the display panel due to the excessive width of the uneven portion 1140.

In an example, as shown in FIG. 3, an extension line of the abovementioned uneven portion 1140 passes through a geometric center 200 of the hollow region 20. That is, when manufacturing the display panel, the display region 10 of the display panel can be divided into at least two parts by any straight line passing through the geometry center 200 of the hollow region 20 in such a manner that each part of the display region 10 extends from an edge of the display panel to inside of the display panel. Then, the functional layer 114 covering the entire display region 10 is manufacture using a mask by at least two vapor deposition processes. Correspondingly, as shown in FIG. 5, the shielding portion of the used first mask 301 and the shielding portion of the used second mask 302 can extend from respective edges of the first mask 301 and the second mask 302 to inside. In this way, when manufacturing the display panel including the hollow region 20, it is not necessary to perform cutting and the like operation on the hollow region 20 of the display panel. As a result, cutting residues can be avoided, and thus reliable packaging of the display panel can be achieved. Moreover, since the shielding portions of the first mask and the second mask extend from the respective edges of the first mask 301 and the second mask 302 into the first mask 301 and the second mask 302, there is no need to additionally provide a support pillar for the masks to support the shielding portions. In this way, the influence on vapor deposition of the display region 10 can be avoided, and the problem that the position other than the hollow region 20 cannot be vapor-deposited can be avoided.

Figure 7:
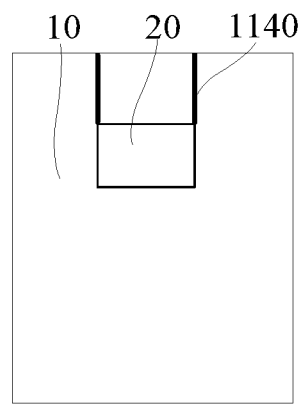
FIG. 7 is a top view of another display panel according to an embodiment of the present disclosure.
Figure 8:
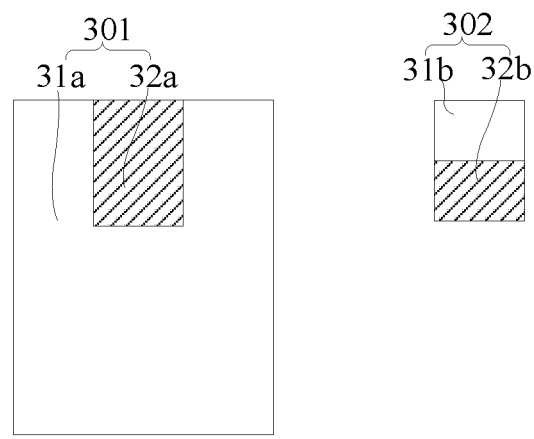
FIG. 8 is a schematic diagram of another mask according to an embodiment of the present disclosure.

In an embodiment, as shown in FIG. 7, which is a schematic diagram of another display panel according to an embodiment of the present disclosure, an extension line of the uneven portion 1140 coincides with an edge of the hollow region 20. That is, when manufacturing the display panel, the display region 10 of the display panel can be vapor-deposited at least twice by using the first mask 301 and the second mask 302 as shown in FIG. 8, which is a schematic diagram of another mask according to an embodiment of the present disclosure. In this way, it can also achieve that each portion into which the display region 10 is divided extends from the edge of the display panel into the display panel. Then, the functional layer 114 covering the entire display region 10 is manufactured using the mask as shown in FIG. 8 by at least two vapor deposition processes. Correspondingly, the shielding portion of the used first mask 301 and the shielding portion of the used second mask 302 can extend from respective edges of the first mask 301 and the second mask 302 into the first mask 301 and the second mask 302. In this way, when manufacturing the display panel including the hollow region 20, it is not necessary to perform cutting and the like operation on the hollow region 20 of the display panel. Moreover, since the respective shielding portions of the first mask 301 and the second mask 302 extend from the respective edges of the first mask 301 and the second mask 302 into the first mask 301 and the second mask 302, there is no need to additionally provide a support pillar for the masks to support the shielding portions. In this way, the influence on vapor deposition of the display region 10 can be avoided, and the problem that the position other than the hollow region 20 cannot be vapor-deposited can be avoided.

Figure 9:
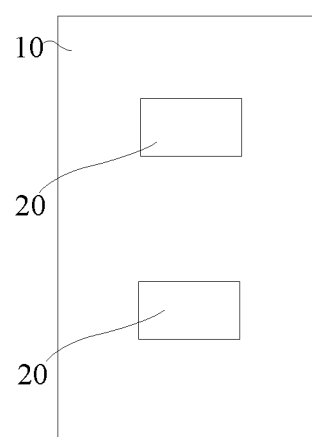
FIG. 9 is a top view of still another display panel according to an embodiment of the present disclosure.

In an example, one or more hollow regions 20 may be provided. As shown in FIG. 9, which is a top view of still another display panel according to an embodiment of the present disclosure, two hollow regions 20 are provided.

Figure 10:
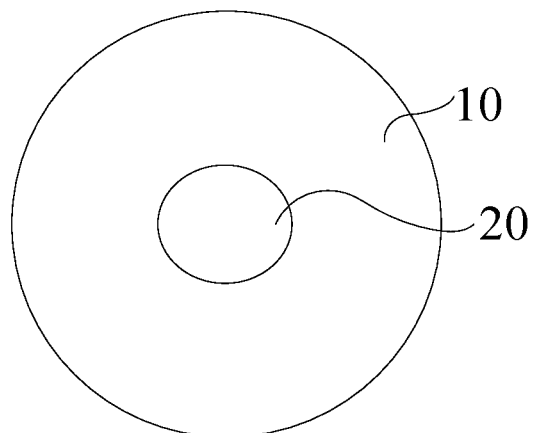
FIG. 10 is a top view of yet still another display panel according to an embodiment of the present disclosure.
Figure 11:
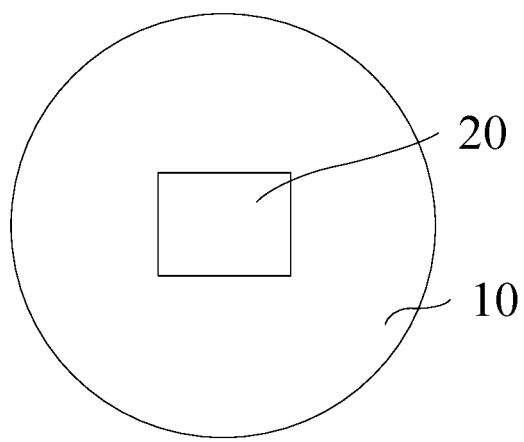
FIG. 11 is a top view of yet still another display panel according to an embodiment of the present disclosure.

In an example, the hollow region 20 and an outer contour of the display region 10 may be shaped as any closed patterns. For example, as shown in FIG. 3, both the outer contour of the display region 10 and the hollow region 20 are shaped as quadrangles. As shown in FIG. 10, which is a top view of yet still another display panel according to an embodiment of the present disclosure, both the outer contour of the display region 10 and the hollow region 20 are shaped as circles. As shown in FIG. 11, which is a top view of yet still another display panel according to an embodiment of the present disclosure, the outer contour of the display region 10 is a shaped as a circle and the hollow region 20 is shaped as a quadrangle. This can be set depending on actual needs, and the present disclosure makes no limitation on this.

Figure 12:
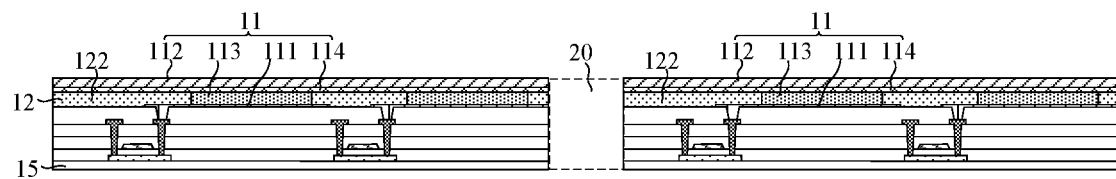
FIG. 12 is a cross-sectional view along BB' of FIG. 3.

For example, as shown in FIG. 4 and FIG. 6, a substrate 15 is further provided in the display region 10 of the display panel. In another embodiment, as shown in FIG. 12, which is a cross-sectional view along BB' of FIG. 3, no substrate is provided in the hollow region 20. When manufacturing the display device such as a watch, a pointer can be placed in the hollow region 20.

An embodiment of the present disclosure further provides a method for manufacturing a display panel. FIG. 13 is a schematic flowchart of a method for manufacturing a display panel according to an embodiment of the present disclosure, and FIG. 14 is a schematic structural flowchart of the method of FIG. 13. As shown in FIG. 13 and FIG. 14, the method includes steps as follows.

At S1, a substrate 15 and a mask are provided. The substrate 15 includes a first region 151 and a second region 152, and a projection of the first region 151 on a plane of the substrate 15 does not overlap with a projection of the second region 152 on the plane of the substrate 15. The first region 151 and the second region 152 each extend from the edge of the substrate 15 into the substrate 15. The mask includes an aperture portion and a shielding portion, and the shielding portion extends from the edge of the mask into the mask.

At S2, a functional layer 114 is formed on a side of the substrate sequentially by vapor deposition through the aperture portion of the mask. As shown in FIG. 14, the functional layer 114 includes a first functional portion 1141, a second functional portion 1142, and an uneven portion 1140. The first functional portion 1141 and the second functional portion 1142 are respectively located on two sides of the uneven portion 1140. The first functional portion 1141 covers the second region 152. The second functional portion 1142 covers the first region 151. The first functional portion 1141 and the second functional portion 1142 are arranged in a same layer.

In the method for manufacturing the display panel provided by this embodiment of the present disclosure, the substrate 15 includes the first region 151 and the second region 152, and the projection of the first region 151 on the plane of the substrate 15 does not overlap with the projection of the second region 152 on the plane of the substrate 15. Moreover, the first region 151 and the second region 152 each extend from the edge of the substrate 15 into the substrate 15. Then, masks are used, and the functional layer 114 including the first functional portion 1141, the second functional portion 1142 and the uneven portion 1140 are formed on the side of the substrate 15 sequentially by vapor deposition through the aperture portion of the masks. Here, the patterns of the masks are in one-to-one correspondence with the respective shapes of the first region and the second region of the substrate 15, that is, the shielding portion of each mask extends from the edge of the mask into the mask. In this way, when manufacturing a display panel that is bendable or includes a hollow region, since the shielding portion of each mask extends from the edge of the mask into the mask, there is no need to additionally provide a support pillar for the mask to support the shielding portion. In this way, the influence on vapor deposition of the substrate 15 can be avoided, and the problem that some region cannot be vapor-deposited can be avoided, thereby improving the display effect of the manufactured display panel.

In an example, as shown in FIG. 14, the abovementioned substrate 15 has a hollow region 20 and a through hole 150 is provided in the hollow region 20, and the first functional portion 1141 and/or the second functional portion 1142 are not formed at the through hole 150.

Figure 15:
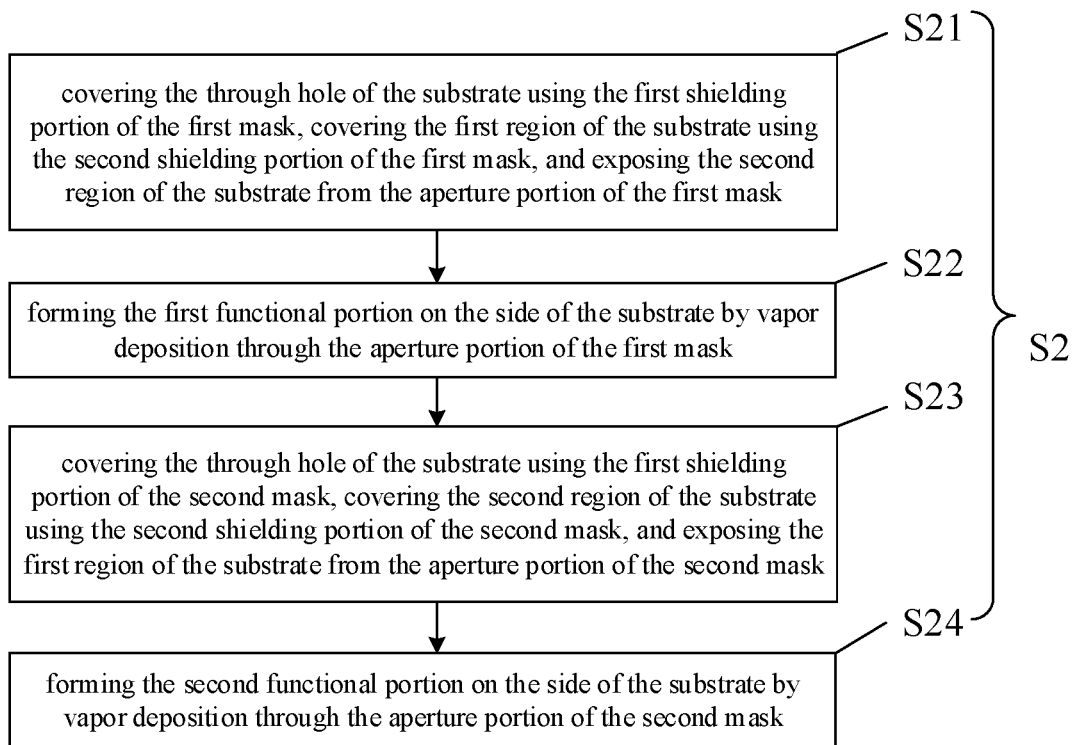
FIG. 15 is a schematic flowchart of another method for manufacturing a display panel according to an embodiment of the present disclosure.

FIG. 15 is a schematic flowchart of another method for manufacturing a display panel according to an embodiment of the present disclosure. In an example, as in FIG. 5, FIG. 14 and FIG. 15, the above mask includes a first mask 301 and a second mask 302. The first mask 301 includes an aperture portion 31a and shielding portions 32a, and the shielding portions 32a include a first shielding portion 321a and a second shielding portion 322a that is connected to the first shielding portion 321a. The second mask 302 includes an aperture portion 31b and shielding portions 32b, and the shielding portions 32b includes a first shielding portion 321b and a second shielding portion 322b that is connected to the first shielding portion 321b. The first shielding portion 321a of the first mask 301 and the first shielding portion 321b of the second mask 302 each have a same shape and a same area as the through hole 150. The second shielding portion 322a of the first mask 301 extends from the edge of the first mask 301 into the first mask 301, and the second shielding portion 322b of the second mask 302 extends from the edge of the second mask 302 into the second mask 302.

The abovementioned step S2 of forming the first functional portion 1141 and the second functional portion 1152 on the side of the substrate 15 sequentially by vapor deposition through the aperture portions of the masks includes the following steps.

At S21, the through hole 150 of the substrate 15 is covered using the first shielding portion 321a of the first mask 301, the first region 151 of the substrate 15 is covered using the second shielding portion 322a of the first mask 301, and the second region 152 of the substrate 15 is exposed from the aperture portion 31a of the first mask 301.

At S22, the first functional portion 1141 is formed on the side of the substrate 15 by vapor deposition through the aperture portion 31a of the first mask 301.

At S23, the through hole 150 of the substrate 15 is covered using the first shielding portion 321b of the second mask 302, the second region 152 of the substrate 15 is covered using the second shielding portion 322b of the second mask 302, and the first region 151 of the substrate 15 is exposed from the aperture portion 31b of the second mask 302.

At S24, the second functional portion 1142 is formed on the side of the substrate 15 by vapor deposition through the aperture portion 31b of the second mask 302.

Figure 16:
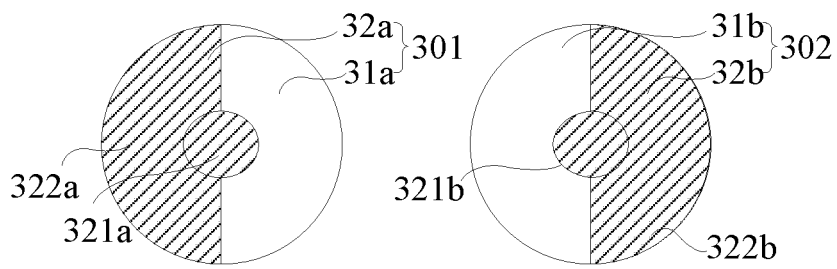
FIG. 16 is a schematic diagram of yet still another mask according to an embodiment of the present disclosure.
Figure 17:
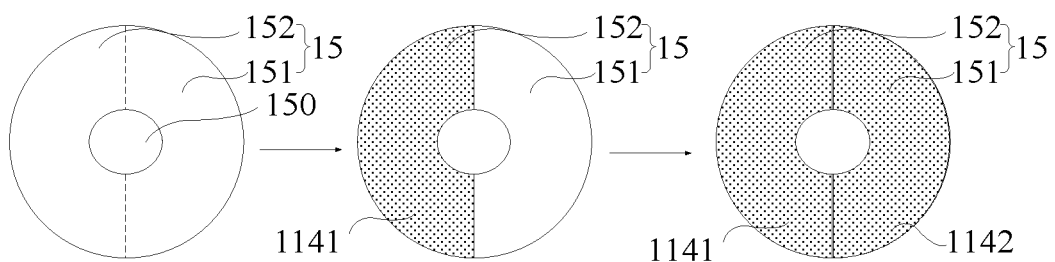
FIG. 17 is a schematic structural flowchart of another method for manufacturing a display panel according to an embodiment of the present disclosure.

FIG. 16 is a schematic diagram of yet still another mask according to an embodiment of the present disclosure, and FIG. 17 is a schematic structural flowchart of another method for manufacturing a display panel according to an embodiment of the present disclosure. In an example, as shown in FIG. 16 and FIG. 17, both the through hole 150 and an outer contour of the substrate 15 are shaped as central symmetrical patterns, and a symmetry center of the through hole 150 coincides with a symmetry center of the substrate 15. The second shielding portion 322a of the first mask 301 has a same shape as the aperture portion 31b of the second mask 302, and the aperture portion 31a of the first mask 301 has a same shape as the second shielding portion 322b of the second mask 302.

The abovementioned step S23 of covering the through hole 150 of the substrate 15 using the first shielding portion 321b of the second mask 302, covering the second region 152 of the substrate 15 using the second shielding portion 322b of the second mask 302 and exposing the first region 151 of the substrate 15 from the aperture portion 31b of the second mask 302 includes: adjusting a position of the first mask 301 relative to the substrate 15 in such a manner that the first shielding portion 321a of the first mask 301 covers the through hole 150 of the substrate 15, the second shielding portion 322a of the first mask 301 covers the second region 152 of the substrate 15, and the aperture portion 31a of the first mask 301 exposes the first region 151 of the substrate 15.

The abovementioned step S24 of forming the second functional portion 1142 on the side of the substrate 15 by vapor deposition through the aperture portion 31b of the second mask 302 includes: forming the second functional portion 1142 on the side of the substrate 15 by vapor deposition through the aperture portion 31a of the first mask 301 having its position adjusted.

That is, in this embodiment of the present disclosure, in a case where the through hole 150 and an outer contour of the substrate 15 are shaped as central symmetrical patterns and the symmetry center of the through hole 150 coincides with the symmetry center of the substrate 15, the first mask 301 can be used as the second mask 302 by only adjusting the position of the first mask 301. In this way, the functional layer 114 can be formed by performing vapor deposition twice through a mask of only one pattern, thereby reducing masks and thus reducing the manufacturing cost of the abovementioned display panel.

Figure 18:
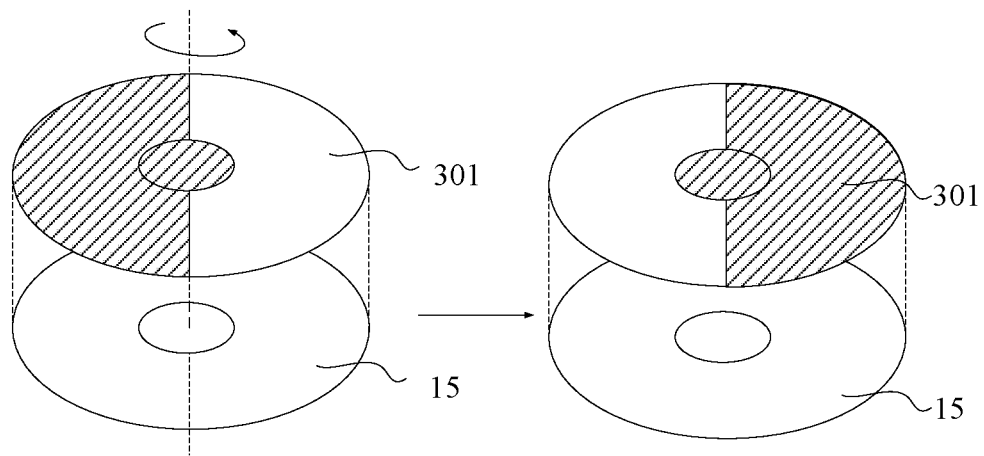
FIG. 18 is a schematic diagram of adjusting a position of a first mask relative to a substrate according to an embodiment of the present disclosure.

For example, the abovementioned step of adjusting the position of the first mask 301 relative to the substrate 15 includes: fixing the first mask 301 and rotating the substrate 15 by 180° about the symmetry center of the substrate 15, or fixing the substrate 15 and rotating the first mask 301 by 180° about the symmetry center of the substrate 15. For example, as shown in FIG. 18, which is a schematic diagram of adjusting a position of the first mask 301 relative to the substrate 15 according to an embodiment of the present disclosure, the substrate 15 is fixed and the first mask 301 is rotated about the symmetry center of the substrate 15.

Figure 19:
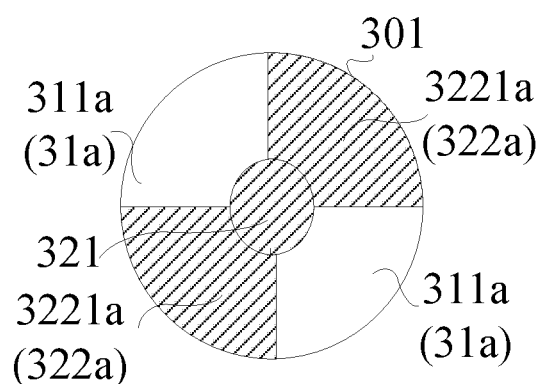
FIG. 19 is another schematic diagram of a first mask according to an embodiment of the present disclosure.

In an example, the through hole 150 and the outer contour of the substrate 15 each can be shaped as a circle or equilateral, and the geometric center of the through hole 150 coincides with the geometric center of the substrate 15. As shown in FIG. 19, which is another schematic diagram of the first mask according to an embodiment of the present disclosure, the second shielding portion 322a of the first mask 301 includes at least two second shielding sub-portions 3221a, and the aperture portion 31a of the first mask 301 includes at least two aperture sub-portions 311a. A number of the aperture sub-portions 311a is equal to a number of the second shielding sub-portions 3221a. The second shielding sub-portions 3221a and the aperture sub-portions 311a are alternately arranged. Each second shielding sub-portion 3221a of the first mask 301 extends from the edge of the first mask 301 into the first mask 301.

Figure 20:
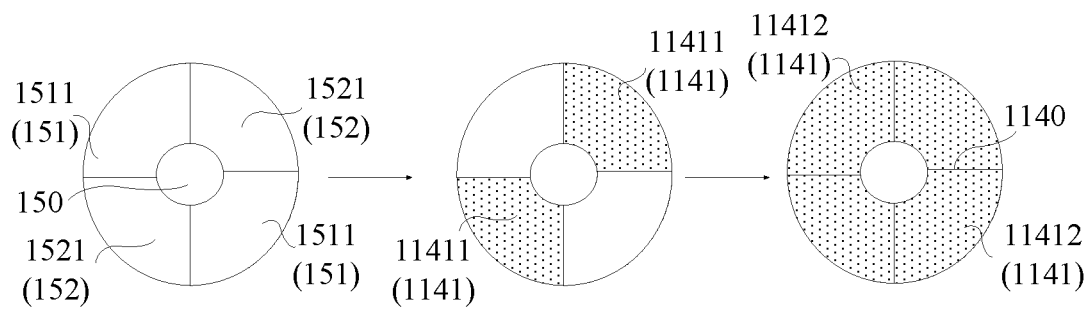
FIG. 20 is a schematic structural flowchart of still another method for manufacturing a display panel according to an embodiment of the present disclosure.

FIG. 20 is a schematic structural flowchart of still another method for manufacturing a display panel according to an embodiment of the present disclosure. As shown in FIG. 20, the first region 151 of the substrate 15 includes at least two first sub-regions 1511, and the second region 152 of the substrate 15 includes at least two second sub-regions 1521. A number of the first sub-regions 1511 is equal to a number of the second sub-regions 1521. The number of the first sub-regions 1511 is equal to a number of the aperture sub-portions 311. The first sub-regions 1511 and the second sub-regions 1521 are alternately arranged. The first functional portion 1141 includes at least two first function sub-layers 11411, and a number of the first functional sub-layers 11411 is equal to the number of the aperture sub-portions 311. The second functional portion 1142 includes at least two second functional sub-layers 11421, and a number of the second functional sub-layers 11421 is equal to the number of the aperture sub-portions 311.

In this case, the abovementioned step S21 of covering the first region 151 of the substrate 15 using the second shielding portion 322a of the first mask 301 and exposing the second region 152 of the substrate 15 from the aperture portion 31a of the first mask 301 includes the following step.

The second shielding sub-portions 3221a of the first mask 301 are aligned with the first sub-regions 1511 of the substrate 15 in one-to-one correspondence, and the aperture sub-portions 311a of the first mask 301 are aligned with the second sub-regions 1521 of the substrate 15 in one-to-one correspondence.

The abovementioned step S22 of forming the first functional portion 1141 on the side of the substrate 15 by vapor deposition through the aperture portion 31a of the first mask 301 includes the following step.

A plurality of first function sub-layers 11411 is formed on the side of the substrate 12 through a plurality of aperture sub-portions 311a of the first mask 301, such that each first function sub-layer 11411 covers a corresponding second sub-region 1521.

The abovementioned step S23 of covering the through hole 150 of the substrate 15 using the first shielding portion 321b of the second mask 302, covering the second region 152 of the substrate 15 using the second shielding portion 322b of the second mask 302 and exposing the first region 151 of the substrate 15 from the aperture portion 31b of the second mask 302 includes the following step.

The position of the first mask 301 relative to the substrate 15 is adjusted in such a manner that the second shielding sub-portions 3221a of the first mask 301 are aligned with the second sub-regions 1521 of the substrate 15, and the aperture sub-portions 311a of the first mask 301 are aligned with the first sub-regions 1511 of the substrate 15.

The abovementioned step S24 of forming the second functional portion 1142 on the side of the substrate 15 by vapor deposition through the aperture portion 31b of the second mask 302 includes the following step.

The second function sub-layer 11421 is formed on the side of the substrate 15 by vapor deposition through the position-adjusted aperture sub-portion 311a of the first mask 301 having its position adjusted, such that each second function sub-layer 11421 covers a respective first sub-region 1511.

It is merely an example in FIG. 20 that the through hole 150 and the outer contour of the display region 10 are shaped as circles. In fact, the through hole 150 and the outer contour of the display region 10 may also be shaped as equilaterals, such as squares, equilateral triangles and the like. The manufacturing method is the same as the manufacturing method as described above in which the through hole 150 and the outer contour of the display region 10 are shaped as circles, and details thereof will not be further described herein.

Therefore, in this embodiment of the present disclosure, when the through hole 150 and the outer contour of the substrate 15 are both shaped as circles or equilaterals, and the geometric center of the through hole 150 coincides with the geometric center of the substrate 15, the first mask 301 can be used as the second mask 302 by only adjusting the position of the first mask 301. In this way, the functional layer 114 can be formed by performing vapor deposition twice through a mask of only one mask, thereby reducing masks and thus reducing the manufacturing cost of the display panel.

Figure 21:
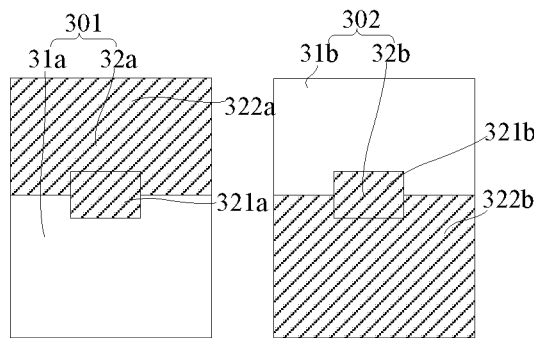
FIG. 21 is a schematic diagram of yet still another mask according to an embodiment of the present disclosure.
Figure 22:
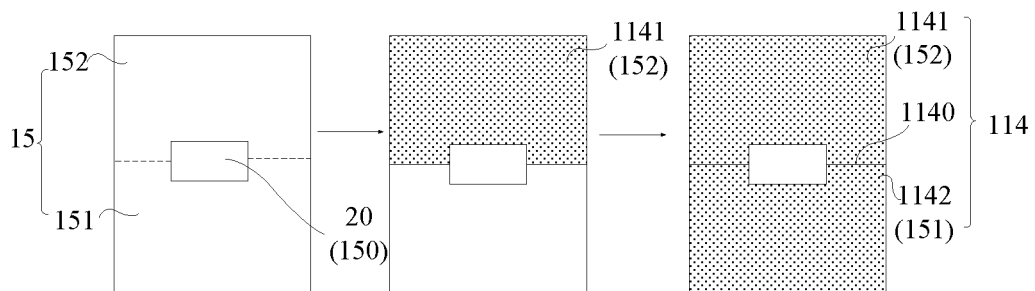
FIG. 22 is a schematic structural flowchart of yet still another method for manufacturing a display panel according to an embodiment of the present disclosure.

FIG. 21 is a schematic diagram of yet still another mask according to an embodiment of the present disclosure, and FIG. 22 is a schematic structural flowchart of yet still another method for manufacturing a display panel according to an embodiment of the present disclosure. In an embodiment, as shown in FIG. 21 and FIG. 22, the through hole 150 and the outer contour of the substrate 15 are both shaped as axisymmetric patterns, and the symmetry axis of the through hole 150 coincides with the symmetry axis of the substrate 15. The second shielding portion 322a of the first mask 301 has a same shape as the aperture portion 31b of the second mask 302, and the aperture portion 31a of the first mask 301 has a same shape as the second shielding portion 322b of the second mask 302.

In this case, the abovementioned step S23 of covering the through hole 150 of the substrate 15 using the first shielding portion 321a of the second mask 302, covering the second region 152 of the substrate 15 using the second shielding portion 322b of the second mask 302 and exposing the first region 151 of the substrate 15 from the aperture portion 31b of the second mask 302, and the abovementioned step S24 of forming the second functional portion 1142 on the side of the substrate 15 by vapor deposition through the aperture portion 31b of the second mask 302 include the following steps.

The substrate 15 is fixed, and the first mask 301 is rotated by 180° about the symmetry axis of the substrate or is rotated by 180° about a center point of the symmetry axis of the substrate in a plane of the first mask, such that the first shielding portion 321a of the first mask 301 covers the through hole 150 of the substrate 15, a second shielding portion 322b of the first mask 301 covers the second region 1521 of the substrate 15, and the aperture portion 31a of the first mask 301 exposes the first region 151 of the substrate 15. Then, a second functional portion 1142 is formed on the side of the substrate 15 by vapor deposition through the aperture portion 31a of the second mask 301.

That is, in this embodiment of the present disclosure, when the through hole 150 and the outer contour of the substrate 15 are both shaped as axisymmetric patterns, and the symmetry axis of the through hole 150 coincides with the symmetry axis of the substrate 15, the first mask 301 can be used as the second mask 302 by only rotating the first mask 301 about the symmetry axis or only rotating the first mask 301 about a center point of the symmetry axis in a plane of the first mask 301. In this way, the functional layer 114 can be formed by performing vapor deposition twice through a mask of only one pattern, thereby reducing masks and thus reducing the manufacturing cost of the display panel.

Figure 23:
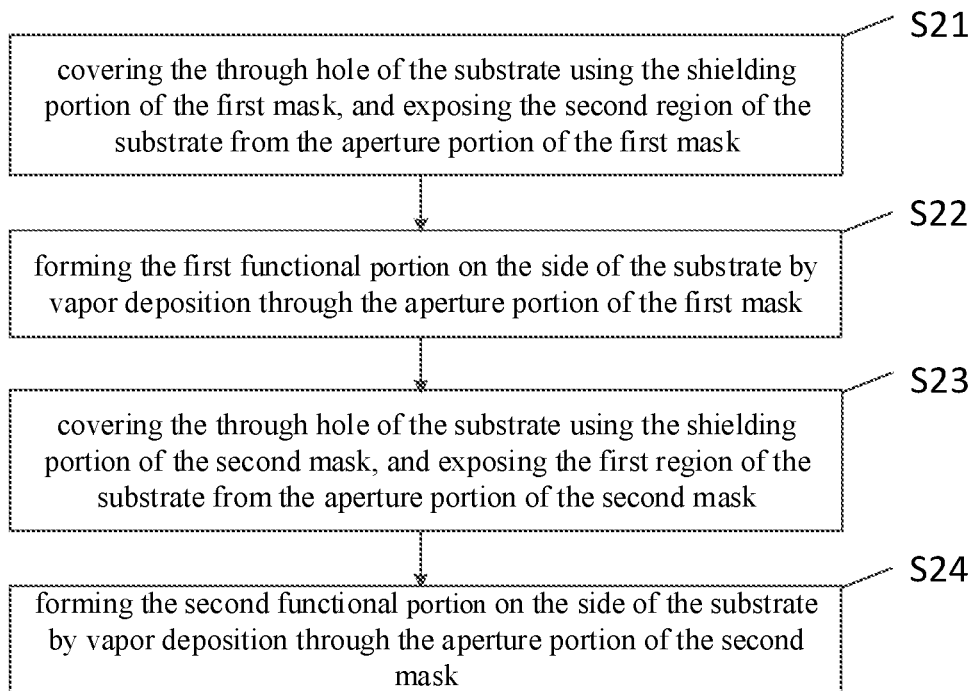
FIG. 23 is a schematic flowchart of still another method for fabricating a display panel according to an embodiment of the present disclosure.
Figure 24:
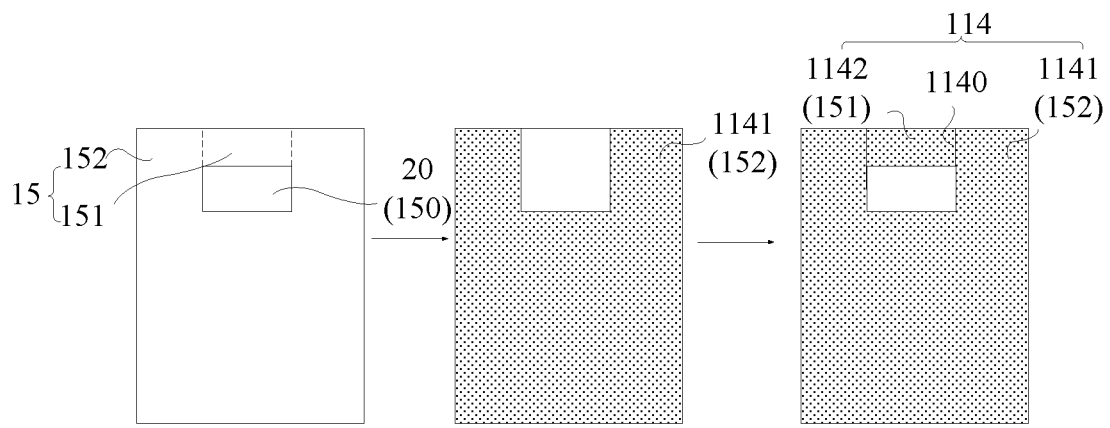
FIG. 24 is a schematic structural flowchart of the method of FIG. 23.

The above description is merely an example of a method for manufacturing a display panel, in which each mask includes a part of the shielding portion having the same shape and the same area as that of the through hole 150. Actually, the shape of the mask is not limited thereto. For example, as shown in FIG. 8, FIG. 23 and FIG. 24, in which FIG. 23 is a schematic flowchart of still another method for fabricating a display panel according to an embodiment of the present disclosure and FIG. 24 is a schematic structural flowchart of the method of FIG. 23, the mask may also be designed as a shape as shown in FIG. 8. Here, the masks include a first mask 301 and a second mask 302. The first mask 301 includes an aperture portion 31a and a shielding portion 32a, and the second mask 302 includes an aperture portion 31b and a shielding portion 32b. The shielding portion 32a of the first mask 301 has an area larger than that of the through hole 150. The second mask 302 has a same shape and a same area as the shielding portion 32a of first mask 301. The shielding portion 32b of the second mask 302 has a same shape and a same area as the through hole 150. Moreover, the shielding portion 32a of the first mask 301 extends from the edge of the first mask 301 into the first mask 301. The shielding portion 32b of the second mask 302 extends from the edge of the second mask 302 into the second mask 302.

In this case, the abovementioned step S2 of forming the first functional portion 1141 and the second functional portion 1152 on the side of the substrate 15 by vapor deposition through the aperture portions of the masks includes the following steps.

At S21, the through hole 150 of the substrate 15 is covered using the shielding portion 32a of a first mask 301, and the second region 152 of the substrate 15 is covered using the aperture portion 31a of the first mask 301.

At S22, the first functional portion 1141 is formed on the side of the substrate 15 by vapor deposition through the aperture portion 31a of the first mask 301.

At S23, the shielding portion 32b of the second mask 302 is aligned with the through hole 150 of the substrate 15, and the aperture portion 31a of the second mask 302 is aligned with the first region 151 of the substrate 15.

At S24, the second functional portion 1142 is formed on the side of the substrate 15 by vapor deposition through the aperture portion 31b of the second mask 302.

Figure 25:
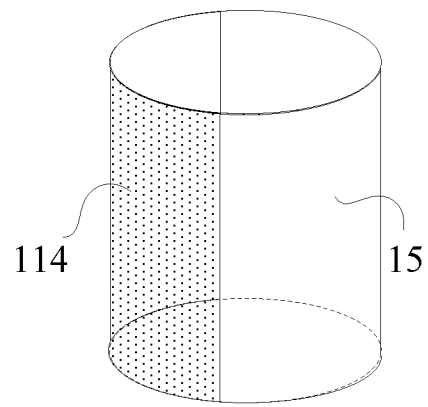
FIG. 25 is a perspective view of another display panel according to an embodiment of the present disclosure.

The abovementioned manufacturing method is not only applied to a display panel including a hollow region provided with a through hole 150, but also applied to a flexible display panel. For example, as shown in FIG. 25, which is a perspective view of another display panel according to an embodiment of the present disclosure, the substrate 15 may be in a curved shape. In this case, the above-described method for manufacturing the display panel may be applied to perform vapor deposition on the curved substrate 15, so as to form the curved display panel as shown in FIG. 25. As an example, FIG. 25 illustrates a functional layer 114 on a display panel after one vapor deposition.

An embodiment of the present disclosure further provides a mask including an aperture portion and a shielding portion, and the shielding portion extends from an edge of the mask into the mask.

In this embodiment of the present disclosure, at least one mask is arranged in the above manner, such that when manufacturing the display panel using the mask, functional layers covering the entire display region can be sequentially manufactured by at least two vapor deposition processes. Moreover, since the shielding portion of the mask extends from the edge of the mask into the mask, when manufacturing the display panel including the hollow region, it is not necessary to perform cutting and the like operation on the hollow region of the display panel. As a result, cutting residues can be avoided, and thus reliable packaging of the display panel can be achieved. Moreover, since the shielding portion of the mask extends from the edge of the mask into the mask, there is no need to provide a support pillar for the mask to support the shielding portion. In this way, the influence on vapor deposition of the display region can be avoided, and the problem that the position other than the hollow region cannot be vapor-deposited can be avoided, thereby improving the display effect of the display panel.

In an example, as shown in FIG. 5, which is a schematic diagram of a mask according to an embodiment of the present disclosure, the mask includes a first mask 301 and a first a second mask 302. The first mask 301 includes an aperture portion 31a and at least one shielding portion 32a, and the at least one shielding portion 32a includes a first shielding portion 321a and a second shielding portion 322a that is connected to the first shielding portion 321a. The second mask 302 includes an aperture portion 31b and at least one shielding portion 32b, and the at least one shielding portion 32b includes a first shielding portion 321b and a second shielding portion 322b that is connected to the first shielding portion 321b. The first shielding portion 321a of the first mask 301 has a same shape and a same area as the first shielding portion 321b of the second mask 302. The second shielding portion 322a of the first mask 301 extends from the edge of the first mask 301 into the first mask 301, and the second shielding portion 322b of the second mask 302 extends from the edge of the second mask 302 into the second mask 302. The second shielding portion 322a of the first mask 301 has a same shape and a same area as the aperture portion 31b of the second mask 302, and the aperture portion 31a of the first mask 301 has a same shape and a same area as the second shielding portion 322b of the second mask 302.

In an example, as shown in FIG. 16, which is a schematic diagram of yet still another mask according to an embodiment of the present disclosure, the first mask 301, the second mask 302, the first shielding portion 321a of the first mask 301 and the first shielding portion 321b of the second mask 302 are shaped as central symmetrical patterns. The symmetry center of the first shielding portion 321a of the first mask 301 coincides with the symmetry center of the first mask 301. The symmetry center of the first shielding portion 321b of the second mask 302 coincides with the symmetry center of the second mask 302.

In an example, as shown in FIG. 19, which is another schematic diagram of a first mask according to an embodiment of the present disclosure, the first mask 301, the second mask 302, the first shielding portion 321a of the first mask 301 and the first shielding portion 321b of the second mask 302 each are shaped as a circle or an equilateral. A geometrical center of the first shielding portion 321a of the first mask 301 coincides with a geometric center of the first mask 301. A geometric center of the first shielding portion 321b of the second mask 302 coincides with a geometric center of the second mask 302. The second shielding portion 322a of the first mask 301 includes at least two second shielding sub-portions 3221a. The aperture portion 31a of the first mask 301 includes at least two aperture sub-portions 311a. The number of the aperture sub-portions 311a is equal to the number of the second shielding sub-portions 3221a. The second shielding sub-portions 3221a and the aperture sub-portions 311a are alternately arranged. Each second shielding sub-portion 3221a of the first mask 301 extends from the edge of the first mask 301 into the first mask 301.

In another example, as shown in FIG. 21, which is a schematic diagram of yet still another mask according to an embodiment of the present disclosure, the first mask 301, the second mask 302, the first shielding portion 321a of the first mask 301 and the first shielding portion 321b of the second mask 302 are shaped as axisymmetric patterns. The symmetry axis of the first shielding portion 321a of the mask 301 coincides with the symmetry axis of the first mask 301, and the symmetry axis of the first shielding portion 321b of the second mask 302 coincides with the symmetry axis of the second mask 302.

In an example, as shown in FIG. 8, which is a schematic diagram of another mask according to an embodiment of the present disclosure, the mask includes a first mask 301 and a second mask 302. The first mask 301 includes an aperture portion 31a and a shielding portion 32a. The second mask 302 includes an aperture portion 31b and a shielding portion 32b. The second mask 302 has a same shape and a same area as the shielding portion 32a of the first mask 301. The shielding portion 32a of the first mask 301 has an area larger than that of the shielding portion 32b of the second mask 302. The shielding portion 32a of the first mask 301 extends from the edge of the first mask 301 into the first mask 301, and the shielding portion 32b of the second mask 302 extends from the edge of the second mask 302 into the second mask 302.

The use of the abovementioned various types of masks is the same as that used in the abovementioned manufacturing method for the display panel, and details thereof will not be further described herein.

Figure 26:
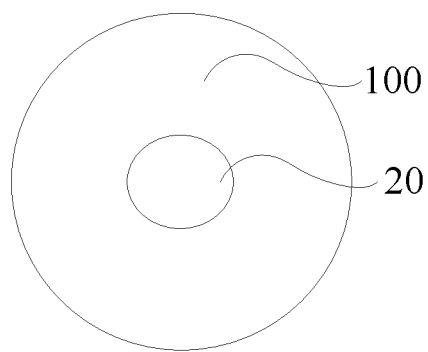
FIG. 26 is a schematic diagram of a display device according to an embodiment of the present disclosure.

An embodiment of the present disclosure further provides a display device. As shown in FIG. 26, which is a schematic diagram of a display device according to an embodiment of the present disclosure, the display device includes the display panel 100 described above, and the display panel 100 includes a hollow region 20. The structure of the display panel 100 has been described in details in the above embodiments, and details thereof will not be further described herein. It should be noted that the display device shown in FIG. 24 is merely illustrative, and the display device can be any electronic device having a display function, such as a watch, a billboard or the like.

For the display device provided in this embodiment, an uneven portion 1140 is provided in a functional layer 114 of a display panel constituting the display device, such that when manufacturing the display panel, the display region 10 of the display panel can be divided into at least two parts. Here, each part of the divided display region 10 extends from an edge of the display panel into the display panel. Then, the first mask 301 and the second mask 302 as shown in FIG. 5 are used to form the functional layer 114 covering the entire display region 10 by at least two vapor deposition processes. Here, the shapes of the first mask 301 and the second mask 302 are in one-to-one correspondence with the respective shapes of the plurality of parts into which the display region 10 is divided. That is, the shielding portions of the first mask 301 and the second mask 302 each extend from the respective edge into a respective one of the first mask 301 and the second mask 302. In this way, when manufacturing the display panel including the hollow region 20, it is not necessary to perform cutting and the like operation on the hollow region 20 of the display panel. As a result, cutting residues can be avoided, and thus reliable packaging of the display panel can be achieved. Moreover, since the shielding portions of the first mask 301 and the second mask 302 each extend from the respective edge into a respective one of the first mask and the second mask, there is no need to provide a support pillar for the first mask 301 or the second mask 302 to support the shielding portion. In this way, the influence on vapor deposition of the display region 10 can be avoided, and the problem that the position other than the hollow region 20 cannot be vapor-deposited can be avoided, thereby improving the display effect of the display panel.

What is claimed is:

1. A mask, comprising an aperture portion and a shielding portion, wherein the shieling portion extends from an edge of the mask into the mask, wherein the mask comprises a first mask and a second mask, and the first mask and the second mask each comprise an aperture portion and a shielding portion; and wherein during usage, an orthographic projection of the shielding portion of the first mask along a direction perpendicular to a plane of the first mask at least partially overlaps with an orthographic projection of the second mask along a direction perpendicular to a plane of the second mask.

2. The mask according to claim 1, wherein
the first mask and the second mask each comprise an aperture portion and at least one shielding portion, and the at least one shielding portion comprises a first shielding portion and a second shielding portion connected to the first shielding portion, the first shielding portion of the first mask has a same shape and a same area as the first shielding portion of the second mask; the second shielding portion of the first mask extends from an edge of the first mask into the first mask, and the second shielding portion of the second mask extends from an edge of the second mask into the second mask; the second shielding portion of the first mask has a same shape and a same area as the aperture portion of the second mask, and the aperture portion of the first mask has a same shape and a same area as the second shielding portion of the second mask.

3. The mask according to claim 2, wherein the first mask, the second mask, the first shielding portion of the first mask, and the first shielding portion of the second mask are all shaped as center symmetrical patterns; and
a symmetry center of the first shielding portion of the first mask coincides with a symmetry center of the first mask, and a symmetry center of the first shielding portion of the second mask coincides with a symmetry center of the second mask.

4. The mask according to claim 2, wherein the first mask, the second mask, the first shielding portion of the first mask, and the first shielding portion of the second mask are all shaped as circles or equilaterals;
a geometric center of the first shielding portion of the first mask coincides with a geometric center of the first mask, and a geometric center of the first shielding portion of the second mask coincides with a geometric center of the second mask;
the second shielding portion of the first mask comprises at least two second shielding sub-portions, and the aperture portion of the first mask comprises at least two aperture sub-portions; a number of the at least two aperture sub-portions is equal to a number of the at least two second shielding sub-portions, the at least two second shielding sub-portions and the at least two aperture sub-portions are alternately arranged, and each of at least two second shielding sub-portions of the first mask extends from the edge of the first mask into the first mask.

5. The mask according to claim 2, wherein the first mask, the second mask, the first shielding portion of the first mask, and the first shielding portion of the second mask are all shaped as axisymmetric patterns; and
a symmetry axis of the first shielding portion of the first mask coincides with a symmetry axis of the first mask, and a symmetry axis of the first shielding portion of the second mask coincides with a symmetry axis of the second mask.

6. The mask according to claim 1, wherein the second mask has a same shape and a same area as the shielding portion of the first mask, the shielding portion of the first mask has an area larger than that of the shielding portion of the second mask, the shielding portion of the first mask extends from an edge of the first mask into the first mask, and the shielding portion of the second mask extends from an edge of the second mask into the second mask.

* * * * *